United States Patent [19]

Ohhinata et al.

[11] 4,125,787
[45] Nov. 14, 1978

[54] SEMICONDUCTOR SWITCH CIRCUIT

[75] Inventors: Ichiro Ohhinata, Yokohama; Shinzi Okuhara, Fujisawa; Mitsuru Kawanami, Yokohama; Michio Tokunaga, Zushi, all of Japan

[73] Assignee: Hitachi, Ltd., Japan

[21] Appl. No.: 790,938

[22] Filed: Apr. 26, 1977

[30] Foreign Application Priority Data

Apr. 28, 1976 [JP] Japan .................................. 51-47704

[51] Int. Cl.$^2$ ...................... H03K 17/72; H03K 17/60
[52] U.S. Cl. ............................. 307/252 A; 307/252 G; 307/252 C; 307/253; 307/305
[58] Field of Search ........... 307/252 R, 252 A, 252 C, 307/252 D, 252 G, 252 M, 252 N, 253, 254, 305; 323/225 C

[56] References Cited

U.S. PATENT DOCUMENTS

| | | | |
|---|---|---|---|
| 3,526,787 | 9/1970 | Stover | 307/254 |
| 3,619,652 | 11/1971 | Ogle | 307/305 X |

*Primary Examiner*—John Zazworsky
*Attorney, Agent, or Firm*—Craig & Antonelli

[57] ABSTRACT

A semiconductor switch circuit comprises a PNPN switch with a PNPN semiconductor four-layered structure equivalently including first and second transistors and a gate terminal, a load current dividing circuit including at least one transistor, a variable impedance bypass circuit including at least one transistor, and a capacitive element. The base and the collector of the transistor included in the load current dividing circuit are connected to the cathode and the anode of the PNPN switch, respectively. The collector and the emitter of the transistor included in the variable impedance bypass circuit are connected to the P-type base of the second transistor of the PNPN switch and to the emitter of the transistor of the load-current-dividing circuit, respectively. The base of the transistor of the variable impedance bypass circuit is connected to the anode of the PNPN switch through the capacitive element and is controlled for gate turn-off operation. The PNPN switch having self-holding ability is combined with a transistor which does not have self-holding ability but current-amplifying ability to divide the load current into a current flowing through the PNPN switch and a collector current of the transistor. No large load current is imposed on the PNPN switch but most of the load current is passed through the transistors thereby to facilitate gate turn-off operation. Further, the PNPN switch is protected against the rate effect by use of the variable impedance bypass circuit. Thus both large and small load currents can be controlled with a small self-holding current.

8 Claims, 9 Drawing Figures

SEMICONDUCTOR SWITCH CIRCUIT

This invention relates to a semiconductor switch circuit including a PNPN switch which permits gate turn-off operation with small power as a switch element for a control device, and which can control both large and small load currents.

A PNPN switch with a gate terminal is used for various control circuits because of its advantages that a large current can be controlled with a gate drive current, that it has a self-holding ability and that it is made high in breakdown voltage in both directions. The PNPN switch with the self-holding ability may be switched off either by cutting off the load current or by applying a negative current to the gate. Generally, the former method is used. The gate turn-off thyristor (abbreviated hereinafter as GTOSCR), by contrast, is designed to facilitate the employment of the latter method. The turn-off gain $G_{OFF}$ (the ratio between the load current and the current required for cutting it off) of GTOSCR is given as $G_{OFF} = \alpha_2/(\alpha_1 + \alpha_2 - 1)$ for a P-type gate, where $\alpha_1$ is the current transmission factor of the PNP portion of the PNPN four-layered structure, and $\alpha_2$ the current transmission factor of the NPN portion thereof. If the value of $G_{OFF}$ is to be increased, it is necessary that $\alpha_2$ be as large as possible and that the value $(\alpha_1 + \alpha_2)$ be slightly larger than unity. Because of this need for minimizing the current transmission factor $\alpha_1$ of the PNP portion and maximizing the current transmission factor $\alpha_2$ of the NPN portion of GTOSCR, it is necessary to selectively diffuse gold only in the N-type base layer thereof.

Further, if the lateral resistance of the gate layer (P-type gate layer) is large, the voltage drop across this resistance causes a forward bias to be automatically applied between the gate and the cathode. To cut off a large load current, a very large negative current has to be taken out, resulting in requirement of a large controlling power. Therefore, the problem is that, in order to minimize this resistance, it will be necessary to give the gate electrode to such a special shape as a ring or comb.

The semiconductor switch circuit which has already been proposed by the present inventors as a circuit arrangement capable of cutting off a large load current without using any GTOSCR, which gold is selectively diffused in, uses an ordinary PNPN switch with low resistance of the gate layer, which permits gate turn-off operation with small power but is not suitable for use with a small load current. The foregoing prior art circuit arrangement will be described in detail later.

Accordingly, an object of the present invention is to provide a semiconductor switch circuit which permits gate-off operation with small power whereby a large load current can be cut off with small power by use of an ordinary PNPN switch.

Another object of the invention is to provide a semiconductor switch circuit with large $dv/dt$ immunity, which employs an ordinary PNPN switch and is suitable for use with a small load current.

Still another object of the invention is to provide a semiconductor switch circuit which permits high-speed gate turn-off operation by use of an ordinary PNPN switch.

A further object of the present invention is to provide a semiconductor switch circuit with high $dv/dt$ immunity and high gate-firing sensitivity which has a high breakdown voltage in both directions.

According to the present invention, there is provided a semiconductor switch circuit comprising a PNPN switch with a PNPN semiconductor four-layered structure, a load current dividing circuit including at least a transistor so connected that part of the load current flowing through the PNPN switch flows into the base of the transistor and the remaining load current flows as a collector current of the transistor, and a variable impedance bypass circuit including at least a switch element so connected that at least two of the PN junctions including a PN junction adjacent to one end of the PNPN switch and the base-emitter junction of the transistor of the load current dividing circuit are short-circuited, which switch element has a control terminal so connected as to divide part of the load current through a capacitive element.

The above and other objects, features and advantages will be apparent from the following detailed description with reference to the accompanying drawings, in which.

Figure 1:
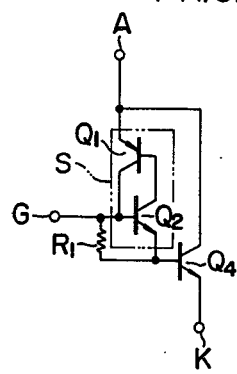
FIG. 1 is a diagram showing an equivalent circuit of the semiconductor switch circuit formerly suggested by the inventors.

For better understanding of the present invention, in the first place, the conventional semiconductor switch circuit as shown in FIG. 1, which the present inventors have already proposed, will be described in detail below.

This circuit uses a PNPN switch S equivalently represented by transistors $Q_1$ and $Q_2$, and a transistor $Q_4$. That part of the load current which flows in the PNPN switch S flows in the base of the transistor $Q_4$, while most of the load current flows through the collector of the transistor $Q_4$. This circuit, however, is not suitable for use with a small load current for the reasons mentioned below.

Assume that the emitter-grounded current amplification factor of the transistor $Q_4$ is given as $h_{FEQ4}$. The relation between the load current $I_O$ and the current $I_1$ flowing in the PNPN switch S under the self-holding condition is expressed as $$I_1 = \frac{I_0}{1 + h_{FEQ4}} \quad (1)$$

This shows that the larger is the current amplification factor $h_{FEQ4}$ of the transistor $Q_4$, the smaller is the current flowing in the PNPN switch S, and thus the gate turn-off operation is facilitated. From the viewpoint of the self-holding ability of this circuit, the minimum self-holding load current flowing through both the PNPN switch and the transistor $Q_4$ is given as $$I_{OHMIN} = I_{1HMIN}(1 + h_{FEQ4}) \quad (2)$$

where $I_{1HMIN}$ is the minimum self-holding current of the PNPN switch itself. It is seen from the above equation (2) that the larger is the current amplification factor $h_{FEQ4}$ of the transistor $Q_4$, the larger is the minimum self-holding load current. Therefore, if the circuit is desired to be used even with a small load current, the minimum self-holding current $I_{1HMIN}$ of the PNPN switch S itself must be small. Notwithstanding, the PNPN switch S is accompanied by the *dv/dt* effect (rate effect) under which, when a transient voltage *dv/dt* is applied between the anode A and the cathode K, the displacement current flowing through the PN junction capacity takes the form of a gate current, thereby erroneously turning off the circuit. To prevent this phenomenon, a bypass resistor $R_1$ is generally inserted between the gate G and the cathode K of the PNPN switch S, leading to the disadvantages that the gate firing sensitivity and a larger self-holding current will increase. In other words, the minimum self-holding current is given as $$I_{1HMIN} = \frac{V_{BEQ2}}{R_1 \cdot \alpha_{a1}} \quad (3)$$

where $\alpha_{a1}$ is the current transmission factor of the PNP transitor $Q_1$ of the PNPN switch S, and $V_{BEQ2}$ is a voltage in the forward direction between the base and emitter of the NPN transistor $Q_2$ thereof when the PNPN switch is turned on. If the value of the resistor $R_1$ is reduced to prevent the erroneous turn-off of the PNPN switch upon application of a large transient voltage *dv/dt*, the minimum self-holding current $I_{1HMIN}$ is undesirably increased.

For the reason, the semiconductor switch circuit shown in FIG. 1 is not suitable for use with a small load current.

Figure 2:
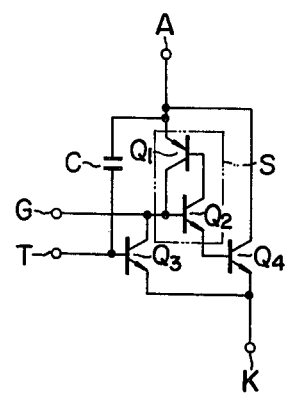
FIG. 2 is a diagram showing an equivalent circuit of a first embodiment of the semiconductor switch circuit according to the present invention.

Reference is had to FIG. 2 showing an equivalent circuit of a first embodiment of the present invention. Reference characters $Q_1$ and $Q_2$ show PNP and NPN transistors respectively making up a PNPN switch S, character $Q_4$ a load current dividing transistor, character $Q_3$ a transistor making up a variable impedance bypass circuit for rate effect protection and a gate turn-off operation, and character C a capacitor for supplying the base current at the time of application of a transient voltage to enable the rate effect protection by the transistor $Q_3$.

When this circuit is held on under normal conditions, no base current is supplied to the transistor $Q_3$ through the capacitor C. The transistor $Q_3$ is thus kept off and the impedance between the collector and the emitter of this transistor $Q_3$ is so high that the minimum self-holding current of the PNPN switch S is very small. Unlike the circuit configuration of FIG. 1 including the resistor $R_1$, therefore, the circuit of FIG. 2 may be used as a switch having a self-holding ability even in the range of small load current. Further, while the PNPN switch S is turned on, most of the load current flows through the collector of the transistor $Q_4$, and therefore the gate turn-off operation of the PNPN switch S is performed easily even under a large load current. The gate turn-off operation is accomplished by supplying the base current to the base terminal T of the transistor $Q_3$ thereby a short-circuit the two series-connected base-emitter junctions of the transistors $Q_2$ and $Q_4$. The gate turn-off operation is of course likewise accomplished by use of another circuit for taking a current out of the gate terminal G. Further, transistor $Q_4$, the base-collector junction of which is operated in an active region reversely biased, is turned off at high speed.

Next, assume that the semiconductor switch circuit according to the invention is in off state. When a steep transient voltage is applied between the anode A and the terminal K equivalent to a cathode, the transistor $Q_3$ is driven through the capacitor C, so that the impedance between the collector and emitter thereof is reduced, thereby bypassing the displacement current flowing through the reverse-biased PN junction of the PNPN switch S. In this way, the erroneous turn-on of the switch circuit is prevented. In other words, the transistor $Q_3$ has two important functions; one is to perform the gate turn-off operation in response to the base current supplied from the terminal T; and the other is to prevent the erroneous turn-on of the switch circuit which otherwise might result from the rate effect due to the base transient current supplied through the capacitor C. Under the normal conditions where the base current is supplied neither from the terminal T nor from the capacitor C, the transistor $Q_3$ is of course kept turned off and the impedance between the collector and emitter thereof is high. The switch circuit therefore can be turned on with a small current supplied to the gate terminal G.

In this way, the gate turn-off operation of this switch circuit is easily accomplished with large *dv/dt* immunity and a small gate current.

Various modifications of the circuit configurations of the semiconductor switch according to the present invention are possible.

Figure 3:
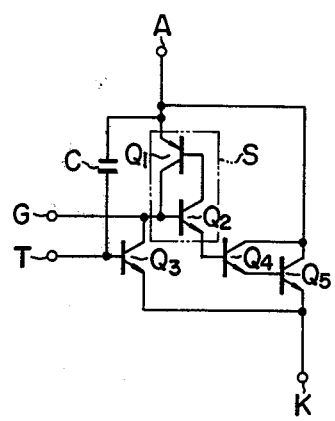
FIGS. 3, 4, 5, 6, 7, 8 and 9 are diagrams showing equivalent circuits of second, third, fourth, fifth, sixth, seventh and eighth embodiments respectively of the semiconductor switch circuit according to the present invention.

FIG. 3 shows a second embodiment of the semiconductor switch circuit according to the present invention, which is suitable for cutting off a larger load current. This embodiment comprises a load current dividing circuit including transistors $Q_4$ and $Q_5$ connected in Darlington pair. From the above equation (1), the larger is the current amplification factor $h_{FEQ4}$ of the transistor $Q_4$, the smaller is the current flowing in the PNPN switch S. It is well known that the total current amplification factor of the Darlington pair of transistors $Q_4$ and $Q_5$ is the product of the current amplification factors of the respective transistors and is larger than the sum thereof. In this case, assume that $h_{FEQ5}$ is the emitter-grounded current amplification factor of the transistor $Q_5$. The current $I_1$ flowing in the PNPN switch S is given as $$I_1 = \frac{I_0}{1 + h_{FEQ4} \cdot h_{FEQ5}} \quad (4)$$

It is seen that only small part of the load current $I_0$ flows in the PNPN switch S, and therefore the gate turn-off operation is made possible even under a larger load current $I_0$.

Figure 4:
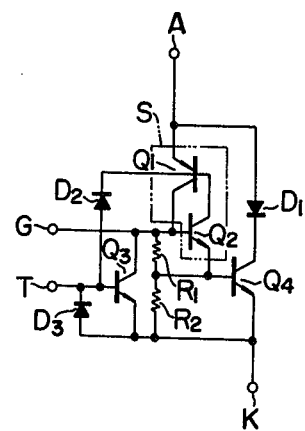

A modification of the circuit of FIG. 3 is shown in FIG. 4. Characters $Q_1$, $Q_2$, $Q_3$ and $Q_4$ show transistors having functions similar to those in FIG. 2, character $D_1$ designates a diode for increasing the reverse breakdown voltage of the load current dividing circuit, character $D_2$ a diode replacing the capacitor C for passing the transient base current of the transistor $Q_2$, character $D_3$ for clamping the reverse voltage applied so as to deeply bias between the base and emitter of the transistor $Q_3$ when the PNPN switch S and the transistor $Q_4$ are turned on and characters $R_1$ and $R_2$ resistors for preventing the erroneous turn-on of the switch circuit or reduction in breakdown voltage which might result from a small leakage current of the elements connected to the PNPN switch S or gate G, or the erroneous turn-on of the switch circuit which might be caused by small rate effect incapable of turning on the transistor $Q_3$.

The fundamental principle of operation of this switch circuit is the same as that of FIG. 2. In other words, most of the load current flows through the load current dividing circuit including the transistor $Q_4$ and the diode $D_1$, and thus the gate turn-off operation of the PNPN switch S is facilitated. Also, the gate turn-off operation may be alternatively performed by short-circuiting the two series-connected base-emitter junctions of the transistors $Q_2$ and $Q_4$ by supplying a base current to the base terminal T of the transistor $Q_3$. Further, the variable impedance bypass circuit for rate effect protection, comprising the transistor $Q_3$, the diodes $D_2$ and $D_3$ and the resistors $R_1$ and $R_2$, obviates the disadvantage of the bypass circuit with a constant impedance utilizing only the short-circuiting by the resistor as shown in FIG. 1, in which the increase of $dv/dt$ immunity increases the minimum self-holding current. Thus, the circuit under consideration may be used as a switch with a self-holding ability even under a small load current.

This circuit configuration has other advantages. First, the provision of the diode $D_1$ for increasing the reverse breakdown voltage gives a high bidirectional breakdown voltage which is the advantage of the PNPN switch. Secondly, the use of the diode $D_2$ in place of the capacitor C as an impedance element for passing the transient current of the transistor $Q_3$ for rate effect protection facilitates the circuit integration of the switch circuit. The reason why the cathode of the diode $D_2$ is connected not to the anode A of the PNPN switch S but to the N-type base of the transistor $Q_1$ is to prevent adverse effect on tthe advantage of the bidirectional high breakdown voltages of the PNPN switch. The insertion of the clamping D diode $D_3$ between the base and emitter of the transistor $Q_3$, on the other hand, prevents the base-emitter circuit of the transistor $Q_3$ from being reversely biased to the reverse breakdown voltage when the PNPN switch S is turned off, thereby preventing the reduction in the rate effect protecting ability upon application of repetitive transient voltages. By connecting the resistors $R_1$ and $R_2$, it is possible to prevent the erroneous turn-on of the circuit which otherwise might result from the small leakage current in the collector-base junction of the PNPN switch S or the small leakage current from the circuit connected to the gate terminal G. Further, the erroneous turn-on, which otherwise might be caused by the rate effect small enough not to sufficiently turn on the transistor $Q_3$, is prevented, thereby providing a stable switch. Furthermore, the resistor $R_2$ functions as a path for releasing stored charges of the transistor $Q_4$, thus making possible highspeed operation. The function of transistor $Q_3$ desirably limits the functions of the resistors $R_1$ and $R_2$ to the bypassing of only a small current as mentioned above. Therefore, these resistors may have a high resistance value, thereby minimizing the disadvantages of the increase of the minimum self-holding current of the PNPN switch S or the reduction of the gate firing sensitivity thereof. As compared with the conventional circuit using only the resistor for short-circuiting, both the minimum self-holding current and the gate-firing current may be reduced extremely.

Figure 5:
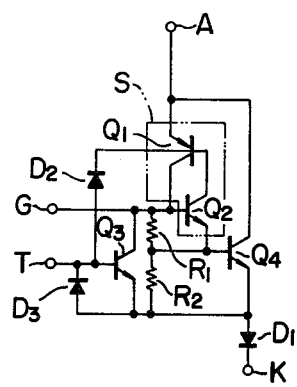

A fourth embodiment of the present invention is shown in FIG. 5. In this embodiment, the diode $D_1$ for increasing the reverse breakdown voltage of the load current dividing circuit in FIG. 4 is connected outside. As a result, the embodiment under consideration is capable of enduring, to a greater extent than the circuit of FIG. 4, the reverse current flowing into the control system through the gate terminal G and gate cut-off terminal T. The other operations of the circuit under consideration are quite the same as those of FIG. 4 and will not be described.

Figure 6:
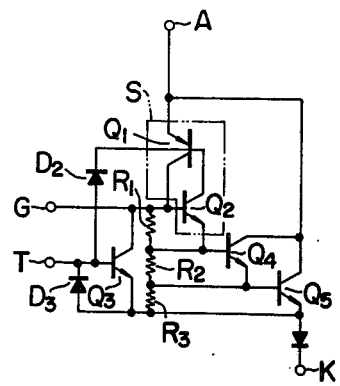

A fifth embodiment of the present invention is illustrated in FIG. 6. This embodiment is so constructed that in order to enable a larger load current to be cut off than in the circuit of FIG. 5, the load-current-dividing circuit includes transistors $Q_4$ and $Q_5$ in Darlington pair. The advantage of this circuit, the detail of which has been described with reference to the circuit of FIG. 3 and will not be repeatedly explained, lies in that, since a much smaller load current than in the circuit of FIG. 5 flows in the PNPN switch S, the gate turn-off operation is possible under a larger load current. The other component elements circuit operations are identical to those in FIG. 5 and will not be explained.

Figure 7:
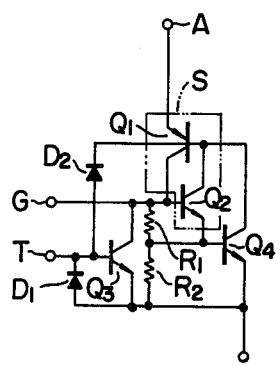

A sixth embodiment of the present invention is shown in FIG. 7. In this embodiment, the diode $D_1$ for increasing the reverse breakdown voltage of the load current dividing circuit in FIG. 4 is eliminated by connecting the collector of the transistor $Q_4$ to the N-type base of the PNP transistor $Q_1$ making up the PNPN switch S. The other component elements and the circuit operation are identical to those in FIG. 4 and therefore will not be described again.

Figure 8:
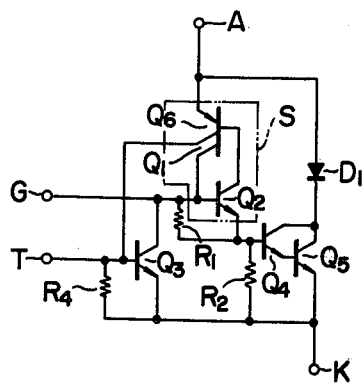

A seventh embodiment of the invention is shown in FIG. 8. In this embodiment, reference character $Q_5$ is a transistor for dividing the load current, which makes up a Darlington pair with the transistor $Q_4$, and character $Q_6$ a transistor having a common emitter and base with the PNP transistor $Q_1$ of the PNPN switch S (the transistors $Q_1$ and $Q_6$ constituting a multi-collector transistor). The transistor $Q_6$ has a function to pass the base transient current of the transistor $Q_3$ for rate effect protection, and acts in a manner similar to the capacitor in FIG. 2 or 3 or diode $D_2$ in FIGS. 3 to 6. Character $R_4$ designates a resistor inserted between the base and emitter of the transistor $Q_3$ for preventing the transistor $Q_3$ from being turned on in response to the current applied from the transistor $Q_6$ in the normal condition where both the PNPN switch S and the transistors $Q_4$ and $Q_5$ are in on state. The resistor $R_4$ also functions as a path for releasing the electric charges stored in the base-emitter junction of the transistor $Q_3$. The remaining component elements are the same as those denoted by the same reference characters in FIG. 4, and the fundamental principle of circuit operation is identical to that of the preceding embodiment.

According to this circuit configuration, the load current dividing circuit is made up of a diode $D_1$ and transistors $Q_4$ and $Q_5$ Darlington pair giving a larger apparent current amplification factor. Further, the transistor $Q_3$ used for gate turn-off operation short-circuits the three series-connected base emitter junctions of the transistors $Q_2$ of the PNPN switch S and the transistors $Q_4$ and $Q_5$, thus making possible gate turn-off operation under a larger load current. The transistor $Q_6$ used in place of the capacitor C in FIGS. 2 and 3 or the diode $D_2$ in FIGS. 3 to 7 has preferably a small current amplification factor and a large capacity of the base-collector junction for the purpose of the operation thereof. In other words, in the normal condition where the PNPN switch is turned on, it is undesirable to turn on the transistor $Q_3$ by the base current supplied from the transistor $Q_6$, since the self-holding current would be increased, leading to a gate turn-off operation in the worst case;

hence the need for elimination of this shortcoming by reducing the DC current amplification factor of the transistor $Q_6$ and the insertion of the resistor $R_3$ between the base and emitter of the transistor $Q_3$. When a transient voltage is applied between the anode A and the cathode K, on the other hand, it is necessary to supply an ample base current to the transistor $Q_3$ for rate effect protection and therefore the capacitance of the base-collector junction of transistor $Q_6$ must be as large as possible. Taking these factors into consideration, the transistor $Q_6$ may be formed only by adding one P-type region to the same isolation region as that of the PNPN switch S in case of semiconductor integrated circuitry, resulting in an advantageous saving of the area occupied by the areas.

Figure 9:
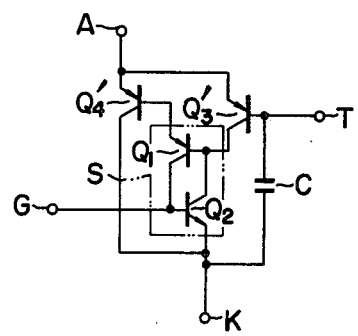

Instead of using the NPN transistors employed in the preceding embodiments, the switch circuit according to the present invention may be realized by use of PNP transistors. Such an alternative is shown in the eighth embodiment of the invention illustrated in FIG. 9, which makes up a circuit configuration complementary to that of FIG. 2. Reference characters $Q_3'$ and $Q_4'$ designate PNP transistors which have the same functions as the NPN transistors $Q_3$ and $Q_4$ in FIG. 2 respectively. In other words, the transistor $Q_4'$ is for dividing the load current, and the transistor $Q_3'$ for gate turn-off operation in response to the base current applied to the terminal T and the rate effect protection by the base current passing through the capacitor C by short-circuiting the two series-connected base-emitter junctions of the transistor $Q_1'$ of the PNPN switch and the transistor $Q_4'$. Although the firing gate terminal G takes the form of the base of the NPN transistor $Q_2'$, i.e., a P-type gate, it may be an N-type gate taking the form of the base of PNP transistor $Q_1'$.

In the aforementioned embodiments, the PNPN switch S may employ a semiconductor device with an integrated structure such as a thyristor or a PNP-NPN complex transistor. Further, the insulation between the main switch and the control system may be improved by use of a light-activated PNPN switch such a "photothyristor". The transistors $Q_3$ and $Q_3'$ performing the rate effect protection and the gate turn-off operation are preferably high in current amplification factor and low in the collector-emitter saturation voltage $V_{CES}$ for the purposes of their operation. Photo-transistors may be used as the transistors $Q_3$ and $Q_3'$ to light-activate the gate turn-off operation for an improved insulation from the control system. Furthermore, the larger is the current amplification factor of the transistor $Q_4$ for dividing the load current, the switch circuit becomes capable of being used for gate turn-off operation under a larger load current.

It will be understood from the foregoing description that according to the present invention, a large load current can be cut off by gate turn-off operation with a small power by means of an ordinary PNPN switch or light-activated thyristor without using a GTOSCR diffused with gold or designed with a lower lateral resistance of the gate layer. Also, it is possible to provide a switch having a self-holding ability even under a small load current. Furthermore, the advantage of the PNPN switch with a high bidirectional breakdown voltage is retained, thus making possible a superior semiconductor switch with high $dv/dt$ immunity and high gate-firing sensitivity.

What is claimed is:

1. A semiconductor switch circuit comprising a PNPN switch having a gate terminal and at least three PN-junctions equivalently including first and second transistors;
   a load current dividing circuit including at least a transistor;
   a variable impedance bypass circuit including at least a transistor; and
   a capacitive element, the base and the collector of said transistor included in said load current dividing circuit being connected respectively to a cathode and an anode of said PNPN switch, the collector and the emitter of said transistor included in said variable impedance bypass circuit being connected respectively to a P-type base of said second transistor of said PNPN switch and the emitter of said transistor included in said load current dividing circuit, and the base of said transistor included in said variable impedance bypass circuit being connected to selected one of the anode of said PNPN switch and an N-type base of said first transistor through said capacitive element, whereby gate turn-off operation of said switch circuit is performed by controlling the base of said transistor included in said variable impedance bypass circuit.

2. A semiconductor switch circuit according to claim 1, in which said load current dividing circuit includes a couple of transistors connected in Darlington pair.

3. A semiconductor switch circuit according to claim 1, in which said variable impedance bypass circuit further includes, a couple of impedance elements and a diode, said diode being inserted between the base and the emitter of said transistor, said couple of said impedance elements being connected in series with each other to make up a series circuit, the ends of said series circuit being connected to the collector and the emitter of said transistor respectively, said couple of said impedance elements having a junction point connected to the base of said transistor included in said load current dividing circuit.

4. A semiconductor switch according to claim 1, in which said variable impedance bypass circuit further includes three impedance elements and a diode, said diode being inserted between the base and the emitter of said transistor, said three impedance elements being connected in series with each other to make up a series circuit, the ends of said series circuit being connected to the collector and the emitter of said transistor respectively, said three impedance elements of said series circuit having the two junction points thereof connected to the bases of said transistors connected in Darlington pair included in said load current dividing circuit respectively.

5. A semiconductor switch circuit according to claim 1, in which said load current dividing circuit comprises a couple of transistors connected in Darlington pair, and a diode connected between the collector of one of said couple of transistors and the anode of said PNPN switch.

6. A semiconductor switch circuit comprising:
   a PNPN swich having a gate terminal and at least three PN-junctions equivalently including first and second transistors;
   a load current dividing circuit including at least a transistor;
   a variable impedance bypass circuit including at least a transistor; and a capacitive element, the base and the collector of said transistor included in said load current dividing circuit being connected to the cathode of said PNPN switch and an N-type base of said first transistor of said PNPN switch, respectively, the collector and the emitter of said transistor included in said variable impedance bypass circuit being connected to a P-type base of said second transistor of said PNPN switch and the emitter of said transistor included in said load current dividing circuit, respectively, and the base of said transistor included in said variable impedance bypass circuit is connected to the N-type base of said first transistor of said PNPN switch through said capacitive element, whereby gate turn-off operation is performed by controlling the base of said transistor included in said variable impedance bypass circuit.

7. A semiconductor switch circuit comprising:
a PNPN switch having a gate terminal and a P-type collector region, said PNPN switch having at least three PN-junctions equivalently including first, second, and third transistors, said first and second transistors having a common emitter and a common base with a multi-collector structure;
a load current dividing circuit including at least a transistor; and
a variable impedance bypass circuit including at least a transistor, the base and the collector of said transistor included in said load current dividing circuit being connected respectively to a cathode and an anode of said PNPN switch, the collector and the emitter of said transistor included in said variable impedance bypass circuit being connected respectively to a P-type base of said third transistor of said PNPN switch and the emitter of said transistor included in said load current dividing circuit, and the base of said transistor included in said variable impedance bypass circuit being connected to said P-type collector region of said second transistor of said PNPN switch, whereby gate turn-off operation is performed by controlling the base of said transistor included in said variable impedance bypass circuit.

8. A semiconductor switch circuit comprising:
a PNPN switch having at least three PN-junctions;
a load current dividing circuit including at least a transistor connected with said PNPN switch so that a base current of said transistor is a part of a load current flowing through said three PN-junctions and a collector current of said transistor is a remaining part of the load current; and
a variable impedance bypass circuit including at least a switching element connected with said PNPN switch and said transistor so as to shunt at least the base-emitter junction of said transistor and one of said three PN-junctions at one end of said PNPN switch connected to said base-emitter junction in series, a control terminal of said switching element being connected through a capacitive element to a selected one of a P-type region and an N-type region which form another one of said three PN-junctions at another end of said PNPN switch.

* * * * *